US010226986B2

(12) United States Patent
Lemmer et al.

(10) Patent No.: US 10,226,986 B2
(45) Date of Patent: *Mar. 12, 2019

(54) ARTICLES INCLUDING ITO INCLUSIVE COATINGS FOR VEHICLE WINDSHIELDS AND/OR METHODS OF MAKING THE SAME

(71) Applicant: Guardian Glass, LLC, Auburn Hills, MI (US)

(72) Inventors: Jean-Marc Lemmer, Wincheringen (DE); Nestor P. Murphy, West Bloomfield, MI (US)

(73) Assignee: Guardian Glass, LLC, Auburn Hills, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/904,519

(22) Filed: Feb. 26, 2018

(65) Prior Publication Data

US 2018/0186217 A1 Jul. 5, 2018

Related U.S. Application Data

(63) Continuation of application No. 15/272,625, filed on Sep. 22, 2016, now Pat. No. 9,902,238, which is a
(Continued)

(51) Int. Cl.
*B32B 15/04* (2006.01)
*B32B 17/06* (2006.01)
(Continued)

(52) U.S. Cl.
CPC .......... *B60J 1/002* (2013.01); *C03C 17/3417* (2013.01); *C03C 17/3435* (2013.01); *C09D 5/00* (2013.01);
(Continued)

(58) Field of Classification Search
USPC ......................................................... 428/426
See application file for complete search history.

(56) References Cited

U.S. PATENT DOCUMENTS

| 4,910,088 A | 3/1990 | Baudin et al. |
| 5,342,676 A | 8/1994 | Zagdoun |

(Continued)

FOREIGN PATENT DOCUMENTS

| DE | 10 2008 028 141 A1 | 12/2009 |
| EP | 1 043 606 A1 | 10/2000 |

(Continued)

OTHER PUBLICATIONS

U.S. Appl. No. 15/272,625, filed Sep. 22, 2016; Lemmer et al.
(Continued)

*Primary Examiner* — Lauren R Colgan
(74) *Attorney, Agent, or Firm* — Nixon & Vanderhye P.C.

(57) ABSTRACT

Certain example embodiments of this invention relate to articles including anti condensation coatings that are exposed to an external environment, and/or methods of making the same. In certain example embodiments, the anticondensation coatings may be survivable in an outside environment. The coatings also may have a sufficiently low sheet resistance and hemispherical emissivity such that the glass surface is more likely to retain heat from the interior area, thereby reducing (and sometimes completely eliminating) the presence condensation thereon. The articles of certain example embodiments may be, for example, skylights, vehicle windows or windshields, IG units, VIG units, refrigerator/freezer doors, and/or the like.

3 Claims, 4 Drawing Sheets

Related U.S. Application Data continuation of application No. 14/625,888, filed on Feb. 19, 2015, now Pat. No. 9,469,767, which is a continuation of application No. 13/870,107, filed on Apr. 25, 2013, now Pat. No. 8,980,386, which is a continuation of application No. 13/647,576, filed on Oct. 9, 2012, now Pat. No. 8,445,083, which is a continuation of application No. 12/662,894, filed on May 10, 2010, now Pat. No. 8,304,045, which is a continuation-in-part of application No. 12/659,196, filed on Feb. 26, 2010, now Pat. No. 8,293,344.

(51) Int. Cl.
| | |
|---|---|
| B60J 1/00 | (2006.01) |
| C03C 17/34 | (2006.01) |
| E06B 3/67 | (2006.01) |
| C09D 5/00 | (2006.01) |
| C23C 14/06 | (2006.01) |
| C23C 14/08 | (2006.01) |
| C23C 14/34 | (2006.01) |
| C23C 28/04 | (2006.01) |

(52) U.S. Cl.
CPC ........ *C23C 14/0652* (2013.01); *C23C 14/081* (2013.01); *C23C 14/083* (2013.01); *C23C 14/086* (2013.01); *C23C 14/34* (2013.01); *C23C 28/04* (2013.01); *E06B 3/6715* (2013.01); *C03C 2217/214* (2013.01); *C03C 2217/22* (2013.01); *C03C 2217/231* (2013.01); *C03C 2217/281* (2013.01); *C03C 2218/154* (2013.01); *Y10T 428/2495* (2015.01)

(56) References Cited

U.S. PATENT DOCUMENTS

| | | | |
|---|---|---|---|
| 5,376,455 A | | 12/1994 | Hartig et al. |
| 5,520,996 A | * | 5/1996 | Balian ................ C03C 17/3417 |
| | | | 428/216 |
| 5,584,902 A | | 12/1996 | Hartig et al. |
| 5,776,594 A | | 7/1998 | Austin |
| 5,776,603 A | | 7/1998 | Zagdoun et al. |
| 5,965,246 A | | 10/1999 | Guiselin et al. |
| 6,052,965 A | | 4/2000 | Florentin et al. |
| 6,144,017 A | | 11/2000 | Millett et al. |
| 6,174,599 B1 | | 1/2001 | Boire et al. |
| 6,579,423 B2 | | 6/2003 | Anzaki et al. |
| 6,606,833 B2 | | 8/2003 | Richardson et al. |
| 6,818,309 B1 | | 11/2004 | Talpaert et al. |
| 6,852,406 B2 | | 2/2005 | Marechal et al. |
| 7,150,849 B2 | | 12/2006 | Veerasamy |
| 8,293,344 B2 | | 10/2012 | Lemmer et al. |
| 8,304,045 B2 | | 11/2012 | Lemmer et al. |
| 8,445,083 B2 | | 5/2013 | Lemmer et al. |
| 8,980,386 B2 | | 3/2015 | Lemmer et al. |
| 9,469,767 B2 | | 10/2016 | Lemmer et al. |
| 9,902,238 B2 | | 2/2018 | Lemmer et al. |
| 2001/0031365 A1 | | 10/2001 | Anderson et al. |
| 2002/0071903 A1 | | 6/2002 | Lee et al. |
| 2002/0192371 A1 | | 12/2002 | Veerasamy et al. |
| 2003/0019859 A1 | | 1/2003 | Sol |
| 2003/0101749 A1 | | 6/2003 | Lingle et al. |
| 2003/0113550 A1 | | 6/2003 | Millett et al. |
| 2004/0137235 A1 | | 7/2004 | Paul et al. |
| 2004/0147139 A1 | | 7/2004 | Jiang |
| 2004/0197574 A1 | | 10/2004 | Stachowiak |
| 2004/0222724 A1 | | 11/2004 | Cording |
| 2005/0041193 A1 | | 2/2005 | Lifka et al. |
| 2005/0042460 A1 | | 2/2005 | Kriltz |
| 2005/0129934 A1 | | 6/2005 | Veerasamy et al. |
| 2005/0191501 A1 | | 9/2005 | Lemmer et al. |
| 2006/0188730 A1 | | 8/2006 | Varanasi et al. |
| 2007/0029186 A1 | | 2/2007 | Krasnov et al. |
| 2007/0184593 A1 | | 8/2007 | Tanaka et al. |
| 2007/0281168 A1 | | 12/2007 | Varanasi et al. |
| 2008/0008829 A1 | | 1/2008 | Blacker et al. |
| 2009/0075069 A1 | * | 3/2009 | Myli .................... C03C 17/002 |
| | | | 428/336 |
| 2009/0229856 A1 | | 9/2009 | Fredenberg et al. |
| 2009/0320824 A1 | * | 12/2009 | Henn .................. C03C 17/3417 |
| | | | 126/500 |
| 2009/0324967 A1 | | 12/2009 | Disteldorf et al. |
| 2010/0035030 A1 | | 2/2010 | Huang et al. |
| 2010/0209729 A1 | | 8/2010 | Thomsen et al. |
| 2010/0209730 A1 | | 8/2010 | Thomsen et al. |
| 2012/0021149 A1 | * | 1/2012 | Myli .................... C03C 17/3411 |
| | | | 428/34 |
| 2012/0048722 A1 | | 3/2012 | McLean et al. |
| 2014/0349041 A1 | * | 11/2014 | Lemmer ............. C03C 17/3681 |
| | | | 428/34 |
| 2015/0239774 A1 | | 8/2015 | Lamine |

FOREIGN PATENT DOCUMENTS

| | | |
|---|---|---|
| GB | 2 031 756 | 4/1980 |
| RU | 2 127 231 | 10/1999 |
| RU | 2 179 537 | 2/2002 |
| WO | WO 95/13189 | 5/1995 |
| WO | WO 01/55752 | 8/2001 |
| WO | WO 2003/093185 | 11/2003 |
| WO | WO 2007/018951 | 2/2007 |
| WO | WO 2009/149889 | 12/2009 |

OTHER PUBLICATIONS

Russian Office Action for Application No. 2012141044 dated Nov. 16, 2016.
EP Office Action for Application No. 11 797 073.1.
U.S. Appl. No. 14/625,888, filed Feb. 19, 2015; Lemmer et al.
U.S. Appl. No. 13/870,107, filed Apr. 25, 2013; Lemmer et al.
"Homogeneously Aligned Liquid Crystal Display on Silicon Oxynitride Thin Film Using Ion Beam Bombardment"; Oh et al., Materials Chemistry and Physics 117 (2009) pp. 355-358.
"A Full Description of a Simple and Scalable Fabrication Process for Electrowetting Displays", Zhou et al., Journal of Micromechanics and Microengineering 19, (2009) pp. 1-12.
U.S. Appl. No. 12/320,664, filed Jun. 4, 2009; Veerasamy.
U.S. Appl. No. 13/647,576, filed Oct. 9, 2012; Lemmer et al.
U.S. Appl. No. 12/385,802, filed Aug. 20, 2009; Lu et al.
U.S. Appl. No. 12/461,792, filed Dec. 31, 2009; Blacker et al.
U.S. Appl. No. 12/591,611, filed Nov. 25, 2009; Veerasamy.
U.S. Appl. No. 12/654,594, filed Dec. 23, 2009; Blacker.
U.S. Appl. No. 12/385,234, filed Aug. 8, 2009; Lemmer.

* cited by examiner

ARTICLES INCLUDING ITO INCLUSIVE COATINGS FOR VEHICLE WINDSHIELDS AND/OR METHODS OF MAKING THE SAME This application is a continuation of U.S. Ser. No. 15/272,625, filed Sep. 22, 2016 (U.S. Pat. No. 9,902,238), which is a continuation of Ser. No. 14/625,888, filed Feb. 19, 2015 (now U.S. Pat. No. 9,469,767), which is a continuation of Ser. No. 13/870,107, filed Apr. 25, 2013 (now U.S. Pat. No. 8,980,386), which is a continuation of Ser. No. 13/647,576, filed Oct. 9, 2012 (now U.S. Pat. No. 8,445,083), which is a continuation of Ser. No. 12/662,894, filed May 10, 2010 (now U.S. Pat. No. 8,304,045), which is a continuation-in-part (CIP) of U.S. Ser. No. 12/659,196, filed Feb. 26, 2010 (now U.S. Pat. No. 8,293,344), the disclosures of which are all hereby incorporated herein by reference.

FIELD OF THE INVENTION

Certain example embodiments of this invention relate to articles including anticondensation coatings, and/or methods of making the same, More particularly, certain example embodiments of this invention relate to articles including anticondensation coatings that are exposed to an external environment, and/or methods of making the same. In certain example embodiments, the anticondensation coatings may be survivable in an outside environment and also may have a low hemispherical emissivity such that the glass surface is more likely to retain heat from the interior area, thereby reducing (and sometimes completely eliminating) the presence condensation thereon. The articles of certain example embodiments may be, for example, skylights, vehicle windows or windshields, IG units, VIG units, refrigerator/freezer doors, and/or the like.

BACKGROUND AND SUMMARY OF EXAMPLE EMBODIMENTS OF THE INVENTION

Moisture is known to condense on skylights, refrigerator/freezer doors, vehicle windows, and other glass products. Condensation buildup on skylights detracts from the aesthetic appeal of the lite. Similarly, condensation buildup on refrigerator/freezer doors in supermarkets or the like sometimes makes it difficult for shoppers to quickly and easily pinpoint the products that they are looking for. And condensation buildup on automobiles often is an annoyance in the morning, as a driver oftentimes must scrape frost or ice and/or actuate the vehicle's defroster and/or windshield wipers to make it safer to drive. Moisture and fog on the windshield oftentimes presents a similar annoyance, although they may also pose potentially more significant safety hazards as a driver traverses hilly areas, as sudden temperature drops occur, etc.

Various anticondensation products have been developed over the years to address these and/or other concerns in a variety of applications, See, for example, U.S. Pat. Nos. 6,818,309; 6,606,833; 6,144,017; 6,052,965; 4,910,088, the entire contents of each of which are hereby incorporated herein by reference. As alluded to above, certain approaches use active heating elements to reduce the buildup of condensation, for example, as in vehicle defrosters, actively heated refrigerator/freezer doors, etc. These active solutions unfortunately take time to work in the vehicle context and thus address the problem once it has occurred. In the case of refrigerator/freezer doors, such active solutions may be expensive and/or energy inefficient.

Some attempts have been made to incorporate a thin-film anticondensation coating on a window. These attempts generally have involved pyrolitically depositing a 4000-6000 angstrom thick fluorine-doped tin oxide (FTO) coating on the exterior surface (e.g., surface 1) of a window such as, for example, a skylight. Although pyrolytic deposition techniques are known to present "hard coatings," the FTO unfortunately scratches fairly easily, changes color over time, and suffers from other disadvantages.

Thus, it will be appreciated there is a need in the art for articles including improved thin-film anticondensation coatings, and/or methods of making the same, One aspect of certain example embodiments relates to anticondensation coatings that are suitable for exposure to an external environment, and/or methods of making the same. The external environment in certain example instances may be the outside and/or the inside of a vehicle or house (as opposed to, for example, a more protected area between adjacent substrates).

Another aspect of certain example embodiments relates to anticondensation coatings that have a low sheet resistance and a low hemispherical emissivity such that the glass surface is more likely to retain heat from the interior area, thereby reducing (and sometimes completely eliminating) the presence condensation thereon.

Still another aspect of certain example embodiments relates to coated articles having an anticondensation coating formed on an outer surface and one or more low-E coatings formed on one or more respective interior surfaces of the article. In certain example embodiments, the anticondensation coating may be thermally tempered (e.g., at a temperature of at least 580 degrees C. for at least about 2 minutes, more preferably at least about 5 minutes) or annealed (e.g., at a temperature lower than that required for tempering).

The articles of certain example embodiments may be, for example, skylights, vehicle windows or windshields, IG units, VIG units, refrigerator/freezer doors, and/or the like.

Certain example embodiments of this invention relate to a skylight comprising; first and second substantially parallel, spaced apart glass substrates; a plurality of spacers arranged to help maintain the first and second substrates in substantially parallel, spaced apart relation to one another; an edge seal sealing together the first and second substrates; and an anti condensation coating provided on an exterior surface of the first substrate exposed to an environment external to the skylight, the anticondensation coating comprising the following layers moving away from the first substrate: a layer comprising silicon nitride and/or silicon oxynitnde, a layer comprising a transparent conductive oxide (TCO), a layer comprising silicon nitride, and a layer comprising at least one of zirconium oxide, zirconium nitride, aluminum oxide, and aluminum nitride, wherein the anticondensation coating has a hemispherical emissivity of less than less than 0.23 and a sheet resistance of less than 30 ohms/square. The TCO may be of or including ITO or the like in certain example embodiments of this invention.

Certain example embodiments of this invention relate to a skylight. First and second substantially parallel, spaced apart glass substrates are provided. A plurality of spacers are arranged to help maintain the first and second substrates in substantially parallel, spaced apart relation to one another. An edge seal helps seal together the first and second substrates. An anticondensation coating is provided on an exterior surface of the first substrate exposed to an environment external to the skylight. The anticondensation coating comprises the following thin-film layers deposited in the following order moving away from the first substrate: a silicon-inclusive barrier layer, a first silicon-inclusive contact layer, a layer comprising a transparent conductive oxide (TCO), a second silicon-inclusive contact layer, and a layer of zirconium oxide. The anticondensation coating has a hemispherical emissivity of less than less than 0.23 and a sheet resistance of less than 30 ohms/square.

Certain example embodiments of this invention relate to a coated article comprising: a coating supported by a substrate, wherein the coating is an anticondensation coating comprising the following layers moving away from the first substrate: a layer comprising silicon nitride and/or silicon oxynitride, a layer comprising a transparent conductive oxide (TCO), a layer comprising silicon nitride, and a layer comprising one or more of zirconium oxide, zirconium nitride, aluminum oxide, and aluminum nitride, wherein the anti condensation coating is disposed on an exterior surface of the substrate such that the anticondensation coating is exposed to an external environment, and the anti condensation coating has a hemispherical emissivity of less than less than 0.23 and a sheet resistance of less than 30 ohms/square.

Certain example embodiments of this invention relate to a coated article comprising a coating supported by a substrate. The coating is an anticondensation coating comprising the following thin-film layers deposited in the following order moving away from the first substrate: a silicon-inclusive barrier layer, a first silicon-inclusive contact layer, a layer comprising a transparent conductive oxide (TCO), a second silicon-inclusive contact layer, and a layer of zirconium oxide. The anticondensation coating is disposed on an exterior surface of the substrate such that the anticondensation coating is exposed to an external environment. The anticondensation coating has a hemispherical emissivity of less than less than 0.23 and a sheet resistance of less than 30 ohms/square.

According to certain example embodiments, the external environment is the inside of a house or vehicle. According to certain example embodiments, the external environment is the outside environment. According to certain example embodiments, a low-E coating is provided on the substrate opposite the anticondensation coating.

In certain example embodiments, the coated article may be built into a skylight, window, insulating glass (IG) window, vacuum insulating glass (VIG) window, refrigerator/freezer door, and/or vehicle window or windshield. The anticondensation coating may be provided on surface one and/or surface four of an IG or VIG unit, for example.

The features, aspects, advantages, and example embodiments described herein may be combined to realize yet further embodiments.

BRIEF DESCRIPTION OF THE DRAWINGS

These and other features and advantages may be better and more completely understood by reference to the following detailed description of exemplary illustrative embodiments in conjunction with the drawings, of which.

DETAILED DESCRIPTION OF EXAMPLE EMBODIMENTS OF THE INVENTION

Figure 1:
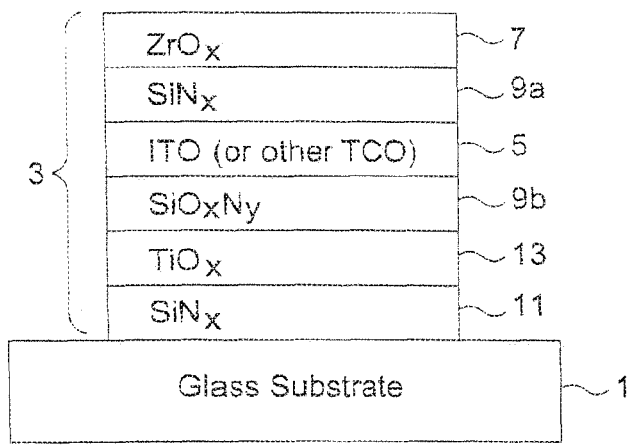
FIG. 1 is a coated article including an anticondensation coating in accordance with an example embodiment.

Referring now more particularly to the accompanying drawings in which like reference numerals indicate like parts in the several views.

Certain example embodiments of this invention relate to thin-film anticondensation coatings that are exposed to the environment. Such coatings have a low hemispherical emissivity in certain example embodiments, which helps the glass surface retain heat provided from the interior side. For instance, in skylight and/or other building window example applications, the glass surface retains more heat from the interior of the building. In vehicle example applications, the windshield retains more heat from the interior of the vehicle. This helps reduce (and sometimes even prevent) the initial formation of condensation. As alluded to above, such anticondensation coatings may be provided on a surface (or multiple surfaces) exposed to the environment in certain example instances. As such, the anticondensation coatings of certain example embodiments may be robust so as to be able to survive such conditions.

Figure 6:
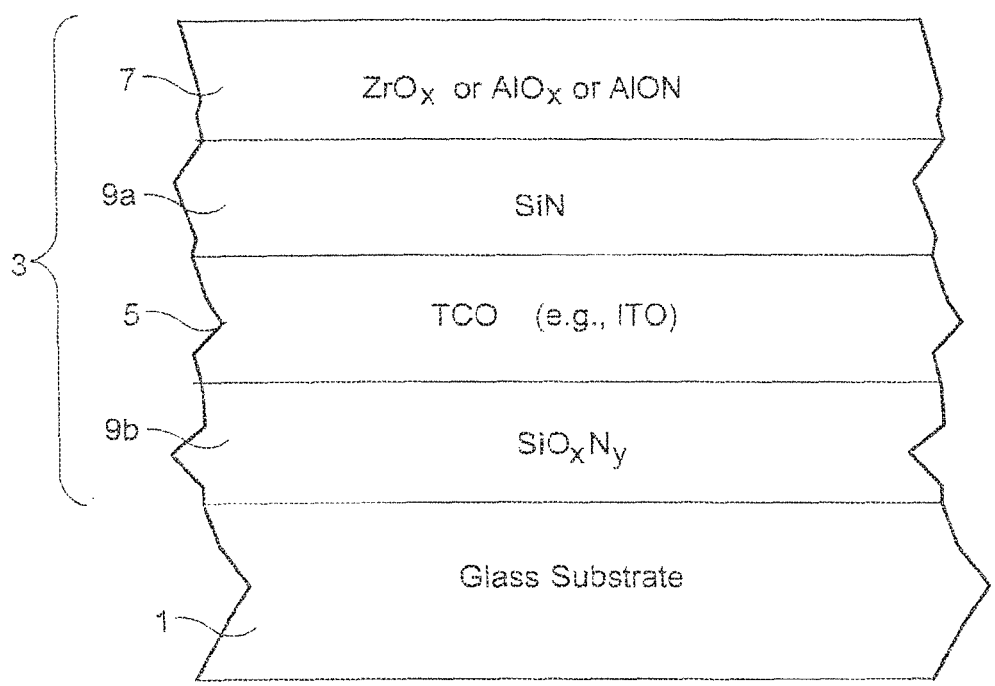
FIG. 6 is a coated article including an anticondensation coating in accordance with an example embodiment of this invention.

FIG. 1 is a coated article including an anticondensation coating in accordance with an example embodiment. The FIG. 1 example embodiment includes a glass substrate 1 supporting a multilayer thin-film anticondensation coating 3. The anticondensation coating 3 has a low hemispherical emissivity. In certain example embodiments, the hemispherical emissivity is less than 0.25, more preferably less than 0.23, still more preferably less than 0.2, and sometimes even less than 1.0-1.5. This is achieved by providing a thin transparent conductive oxide layer (TCO) 5 such that a suitably low sheet resistance is achieved. In the FIG. 1 example, the TCO 5 is indium tin oxide (ITO). A sheet resistance of the 10-30 ohms/square generally will be sufficient to achieve the desired hemispherical emissivity values. Certain example embodiments described herein provide a sheet resistance of 13-27 ohms/square, with the example provided below providing a sheet resistance of 17 ohms/square. In certain example instances, it is possible to select a TCO 5 such that the sheet resistance drops to as low as about 5 ohms/square, although this low value is not need in all embodiments of this invention. FIG. 6 illustrates a coated article including similar layers, except that in the FIG. 6 embodiment layers 11 and 13 are not present. In the FIG. 6 embodiment, silicon oxynitride inclusive layer 9b may be both a silicon-inclusive barrier layer and a lower contact layer, and make be made up of a combination of layers 9b and 11 from the FIG. 1 embodiment. In the FIG. 1 and FIG. 6 embodiments, the overcoat layer 7 may be of or include zirconium oxide, aluminum oxide, aluminum nitride, and/or aluminum oxynitride in example embodiments of this invention. The layers 9a, 9b and 11 of or including silicon nitride and/or silicon oxynitride may be doped with aluminum (e.g., from about 0.5 to 5% Al) in certain example embodiments, as is known in the art, so that Ore target can be conductive during sputtering of the layer.

Referring to FIGS. 1 and 6, the TCO 5 is protected from the environment by a layer or zirconium oxide 7. A silicon-inclusive barrier layer 11 may be provided between the TCO 5 and the substrate 1 also to help protect the TCO 5. e.g., from sodium migration. In the FIG. 1 example, the silicon-inclusive barrier layer 11 is silicon nitride, and the silicon nitride barrier layer 11 is provided adjacent to a layer of titanium oxide 13. The silicon nitride barrier layer 11 and the layer of titanium oxide 13 help with the optics of the overall article. It will be appreciated that a low/high/low layer stack system also may be used to improve the optics of the end product in certain example instances. In certain example embodiments, the silicon nitride barrier layer 11 may be oxided, e.g., so that it is a layer of silicon oxynitride. In other words, layer 11 may be of or include silicon oxynitride for example in certain example embodiments. In certain example embodiments, a barrier layer comprising silicon nitride (e.g., $Si_3N_4$ or other suitable stoichiometry) may replace the silicon-inclusive barrier layer 11 and the titanium oxide layer 13 in the FIG. 1 example.

Additional silicon-inclusive layers 9a and 9b may sandwich the TCO 5. As shown in the, FIG. 1 example, the upper silicon-inclusive layer 9a is a layer of silicon nitride, whereas the lower silicon-inclusive layer 9b is a layer of silicon oxynitride. It will be appreciated that any suitable combination of silicon with oxygen and/or nitrogen may be used in different embodiments of this invention.

The following table provides example physical thicknesses and thickness ranges for the FIG. 1 example embodiment:

|  | Example Thickness Range (nm) | Example Thickness (nm) |
| --- | --- | --- |
| ZrOx (7) | 2-15 | 7 |
| SiNx (9a) | 10-50 | 30 |
| ITO (5) | 75-175 | 130 |
| SiOxNy (9b) | 10-50 | 35 |
| TiOx (13) | 2-10 | 3.5 |
| SiNx (11) | 10-20 | 13 |

The thicknesses for the layers 9b, 5, 9a and 7 for the FIG. 6 embodiment are similar and the above table is also applicable to those layers. However, in the FIG. 6 embodiment, silicon nitride and/or silicon oxynitride based layer 9b may be thicker, e.g., from about 10-200 nm thick, more preferably from about 10-100 nm thick. As indicated above, other TCOs may be used in place of, or in addition to, ITO. For instance, certain example embodiments may incorporate an ITO/Ag/ITO sandwich. Certain example embodiments, may incorporate zinc oxide, aluminum-doped zinc oxide (AZO), p-type aluminum oxide, doped or un-doped Ag, FTO, and/or the like. When Ag is incorporated into the layer stack system as a TCO, layers comprising Ni and/or Cr may be provided directly adjacent (contacting) the Ag. In certain example embodiments, each layer in the layer stack system may be sputter-deposited. In certain example embodiments, one or more layers may be deposited using a different technique. For instance, when FTO is incorporated as the TCO 5, it may be pyrolytically deposited (e.g., using combustion vapor deposition or CVD).

In certain example embodiments, layer of diamond-like carbon (DLC) may be provided directly over and contacting the zirconium oxide. This may help to create a more survivable, hydrophilic-like coating in certain example instances. Hydrophilic coatings generally involve a contact angle of less than or equal to 10 degrees. Sputter-deposited zirconium oxide, tends to have a contact angle of less than about 20 degrees. However, forming DLC on top of the DLC on top of the zirconium oxide helps with its wettability and creates a harder layer. When tempered, for example, a zirconium oxide/DLC layer stack reaches a contact angle of less than or equal to about 15 degrees. Thus, a survivable, hydrophilic-like coating may be achieved. It is noted that this layer may be created by providing a layer of zirconium nitride followed by a layer of DLC which, upon tempering, will produce a layer of zirconium oxide followed by a layer of DLC. See, for example, applicant Ser. No. 12/320,664, which describes a heat treatable coated article including DLC and/or zirconium in its coating. The entire contents of this application are hereby incorporated herein by reference.

In addition or in the alternative, in certain example embodiments, a thin hydrophilic and/or photocatalytic coating may be provided over the zirconium oxide. Such a layer may comprise anatase $TiO_2$, BiO, BiZr, BiSn, SnO, and/or any other suitable material. Such a layer also may help with wettability and/or provide self-cleaning properties to the article.

In certain example embodiments, the zirconium oxide protective layer 7 maybe replaced with aluminum oxide and/or aluminum oxynitride. Additionally, in certain example embodiments, the layer 7 may be initially deposited in multi-layer form so as to include a first layer of or including zirconium nitride directly on silicon nitride inclusive layer 9a, and a second layer of or including diamond-like carbon (DLC). Then, when heat treatment (e.g., thermal tempering including at a temperature(s) of at least about 580 degrees C.) is desired, the coated article is heat treated and the overlying DLC inclusive layer bums off during heat treatment and the zirconium nitride inclusive layer transforms into zirconium oxide thereby resulting in a heat treated coated article having a heat treated layer stack where the layer 7 is of or includes zirconium oxide (e.g., see FIGS. 1 and 6).

Although not shown in the FIG. 1 or FIG. 6 examples, a silver-based low-E coating may be provided on the glass substrate opposite the anticondensation coating 3. For example, the silver-based low-E coaling may be any one of the low-E coatings described in application Ser. Nos. 12/385,234, 12/385,802; 12/461,792: 12/591,611; and 12/654.594, the entire contents of which are hereby incorporated herein by reference. Of course, other low-E coatings commercially available from the assignee of the instant invention and/or other low-E coatings also may be used in connection with different embodiments of this invention. When the coated article is tempered, it may be run through a tempering furnace "face down." In other words, when the coaled article is tempered, the anticondensation coating may face the rollers.

In certain example embodiments, the visible transmission may be high when an anticondensation coating is applied. For example, in certain example embodiments, the visible transmission preferably will be at least about 50%, more preferably at least about 60%, still more preferably at least about 65%. In certain example embodiments, the visible transmission may be 70%, 80%, or even higher.

Figure 2:
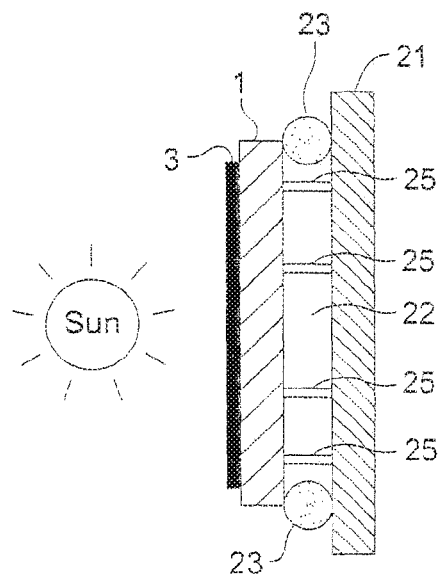
FIG. 2 is an insulating glass unit including an anticondensation coating (e.g., from any embodiment of this invention such as from the FIG. 1 and/or FIG. 6 embodiment) disposed on an outermost surface exposed to the exterior atmosphere in accordance with an example embodiment.

The coated article shown in FIG. 1 or FIG. 6 may be incorporated into a insulating glass (IG) unit. For example, FIG. 2 is an insulating glass unit including an anticondensation coating disposed on an outermost surface exposed to the exterior atmosphere in accordance with an example embodiment. The IG unit in the FIG. 2 example includes first and second substantially parallel spaced apart glass substrates 1 and 21. These substrates define a space or gap 22 therebetwen. The first and second substrates 1 and 21 are sealed using an edge seal 23, and a plurality of pillars 25 help maintain the distance between the first and second substrates 1 and 21. The first substrate 1 supports the anticondensation coating 3. As will be appreciated from the FIG. 2 example embodiment, the anticondensation coating 3 is exposed to the exterior environment. This is a departure from common practices, where low-E coatings generally are protected from the external environment. The FIG. 2 arrangement becomes possible because of the durability of the anticondensation coating 3.

Although not shown in FIG. 2, similar to as described above, a low-E coating (e.g., a silver-based low-E coating) may be provided on an interior surface of one of the first and second substrates 1 and 21. In other words, although not shown in FIG. 2, a low-E coating may be provided on surface 2 or surface 3 of the IG unit shown in FIG. 2.

When the FIG. 2 example embodiment is provided in connection with a skylight application, for example, the outer substrate 1 may be tempered and the inner substrate 21 may be laminated, e.g., for safety purposes. This may be true of other IG unit products, as well, depending on the desired application. In addition, it will be appreciated that the IG unit structure shown in the FIG. 2 example maybe used in connection with generally vertical and generally horizontal applications. In other words, the IG unit structure shown in the FIG. 2 example may be used in refrigerator/freezer doors that are either generally upright or generally horizontal.

In certain example embodiments, the space or gap 22 between the first and second substrates 1 and 21 may be evacuated and/or filed with an inert gas (such as argon, for example), and the edge seal 23 may provide an hermetic seal, e.g., in forming a vacuum insulated glass (VIG) unit.

FIG. 2 shows an IG unit having two glass substrates. However, the example anticondensation coatings described herein may be used in connection with products that contain first, second, and third substantially parallel and spaced apart glass substrates (also sometimes referred to as "triple-glaze" products). The anticondensation coating may be disposed on surface 1 (the outermost surface exposed to the environment), and low-E coatings may be disposed on one or more interior surfaces (surfaces other than surface 1 and surface 6). For example, the anticondensation coating may be disposed on surface 1, and low-E coatings maybe disposed on surfaces 2 and 5, 3 and 5, etc., in different embodiments of this invention. Such triple-glaze products may be IG units containing three lites or substrates, trip VIG units containing three lites or substrates, etc., in different embodiments of this invention.

As indicated above, certain example embodiments may be used in connection with vehicle windshields, windows, mirrors, and/or the like. The hemispherical emissivity of the exterior glass surfaces of a vehicle typically is greater than about 0.84. However, by reducing the hemispherical emissivity to the above-identified (and/or other) ranges, the glass surface may retain more heat provided by the interior of the vehicle. This, in turn, may result in reduced or eliminated condensation buildup on the lite surface, when a moving vehicle goes from colder to warmer climate (e.g., in hilly areas), reduced or eliminated condensation and/or frost buildup on the lite when parked and left over night, etc. The anticondensation coating in vehicle applications may be provided on the side of the glass that is exterior to the vehicle cabin.

The zirconium oxide topcoat is advantageous for vehicle window-applications, as it has a comparatively low coefficient of friction. More particularly, this lower coefficient of friction facilitates the upward and downward movement of windows.

Certain example embodiments may be used in connection with any suitable vehicle including, for example, automobiles; tracks; trains; boats, ships and other vessels; airplanes; tractors and other work equipment; etc. In vehicle mirror applications, the optics of the coating may be tune such that a "double reflection" does not occur.

The inventors of the instant application have also realized that the anticondensation coating of certain example embodiments may be used to help meet the so-called "0.30/0.30 standard." Briefly, the 0.30/0.30 standard refers to a U-value of less than or equal to 0.30 and a solar heat gam coefficient (SHGC) of less than or equal to 0.30. Current legislation in the U.S. would give a tax credit for investing in windows, skylights, doors, etc., that meet these criteria.

Figure 3:
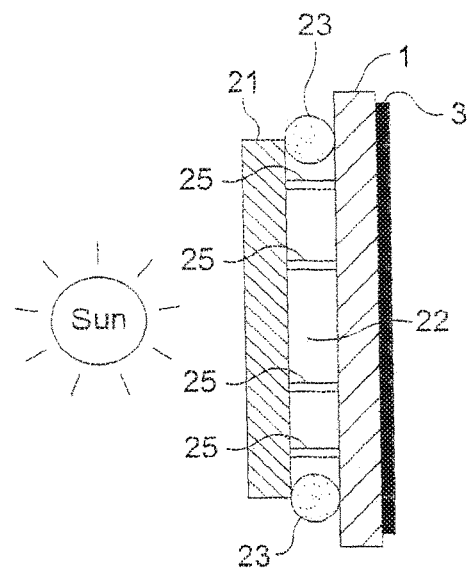
FIG. 3 is an insulating glass unit including an anticondensation coating (e.g., from any embodiment of this invention such as from the FIG. 1 and/or FIG. 6 embodiment) disposed on an innermost surface exposed to the interior environment In accordance with an example embodiment.

FIG. 3 is an insulating glass unit including an anticondensation coating (e.g., see the coating of FIG. 1 and/or FIG. 6) disposed on an innermost surface exposed to the interior environment in accordance with an example embodiment The FIG. 3 example embodiment is similar to the FIG. 2 example embodiment, except that the FIG. 3 example embodiment has the anticondensation coating 3 located on surface 4, which is the exterior surface of the inner glass substrate 1 that is exposed to the building interior rather than the outside environment.

In certain example embodiments, the inner substrate 1 may be annealed (rather than tempered). The anticondensation coating may remain the same or substantially the same as between the FIG. 2 and FIG. 3 example embodiments, although the modifications described above in connection with FIGS. 1, 2 and/or 6 also may be made in connection with an embodiment like FIG. 3. One change that might be made is increasing the thickness of the ITO to achieve the desired U-value performance. In such cases where the ITO is thickened, the thicknesses of the other layers may also be adjusted so that the desired optical properties are achieved. Additional layers also may be added to achieve the desired optical properties. The other structural elements remain the same as between FIGS. 2 and 3, and similar modifications may be made thereto.

When the anticondensation coating 3 is disposed on surface 4 as shown in FIG. 3, the U-value has been determined to be 0.29. When an additional low-E coating is provided on surface 2 of the IG unit, the U-value has been found to drop to 0.23. Certain example embodiments also may provide a SHGC less than or equal to 0.30, thereby helping meet the 0.30/0.30 standard.

Figure 4:
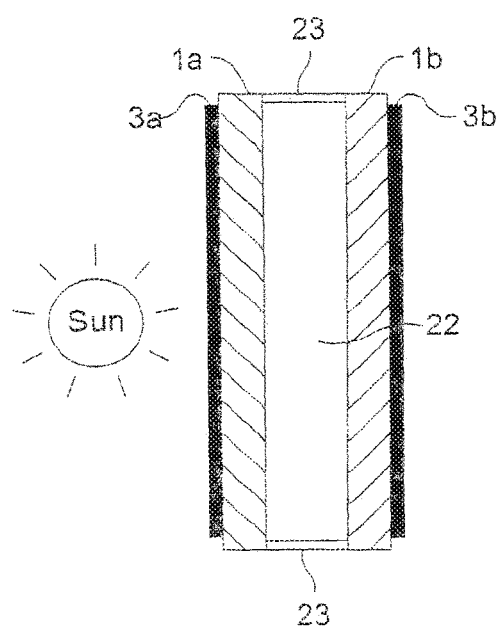
FIG. 4 is an insulating glass unit including anticondensation coatings (e.g., from any embodiment of this invention such as from the FIG. 1 and/or FIG. 6 embodiment) disposed on outermost and innermost surfaces of the insulating glass unit in accordance with an example embodiment.

In products with low U-values (e.g., IG or VIG units with the anticondensation coating on surface 4, two- and three-lite VIG units, etc.), condensation can become a problem, e.g., as the glass is not heated because of the low-emissivity coatings. One solution to this challenge is presented in FIG. 4, which is an insulating glass unit including anticondensation coatings disposed on outermost and innermost surfaces of the insulating glass unit in accordance with an example embodiment. In the FIG. 4 example, first and second substrates 1a and 1b are provided. First and second anticondensation coatings 3a and 3b are provided on surfaces 1 and 4, respectively. In certain example embodiments, additional low-E coatings also may be provided on one or both of the inner surfaces (surfaces 2 and/or 3). In this way, it is possible to provide a product that exhibits U-value reduction and anticondensation behaviors.

Figure 5:
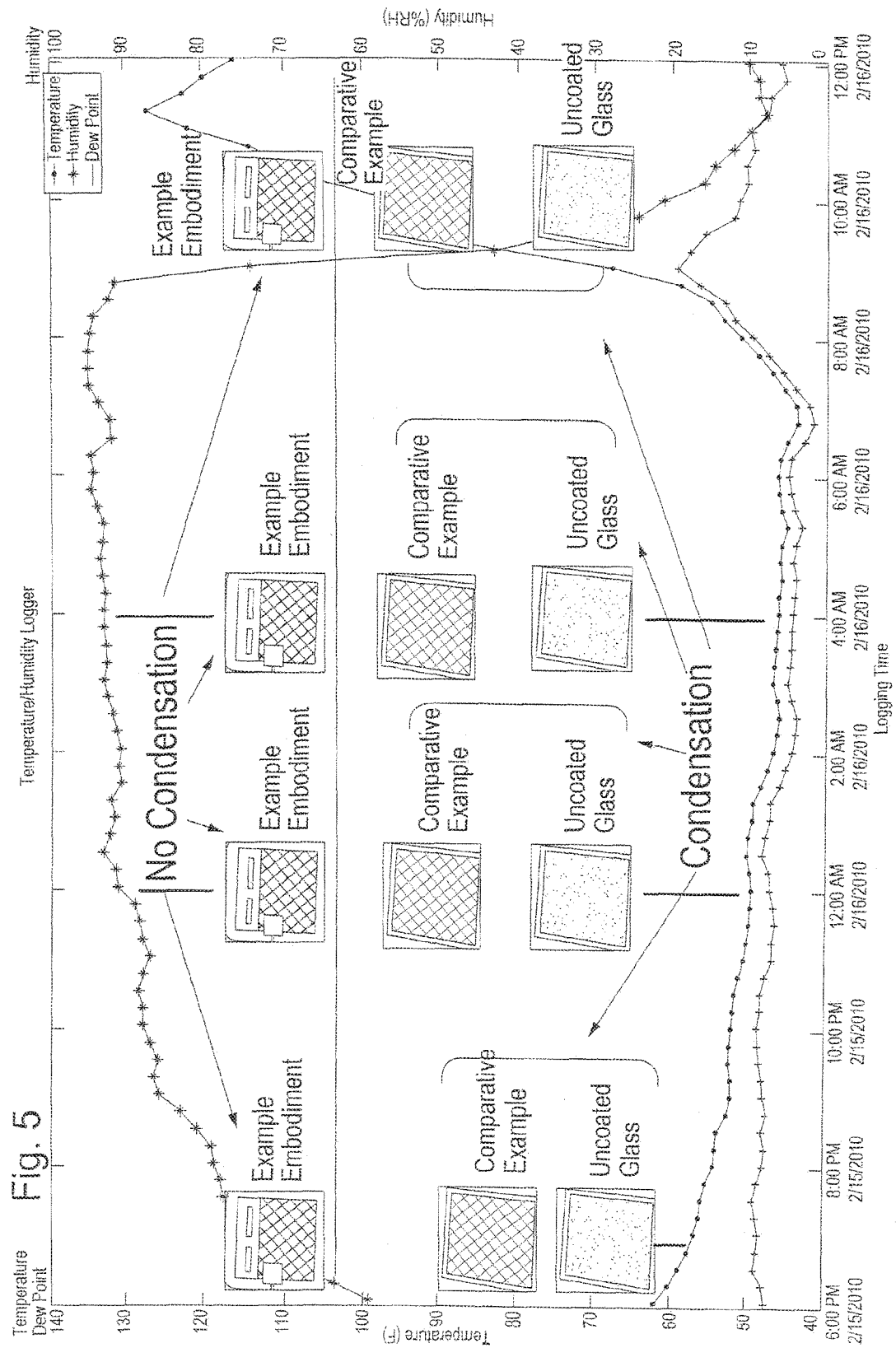
FIG. 5 is a graph illustrating the performance of an example embodiment, a current anticondensation product, and a bare glass substrate as the temperature, humidity, and dew point change over an 18 hour time period.

FIG. 5 is a graph illustrating the performance of an example embodiment, a current anticondensation product, and a bare glass substrate as the temperature, humidity, and dew point change over an 18 hour time period. The images in FIG. 5 each have a "crisscross" pattern printed thereon to help demonstrate the presence or absence of condensation. As can be seen from FIG. 5, there is virtually no condensation formed on those samples that were produced in accordance with an example embodiment. By contrast, the comparative example, which includes pyrolytically deposited FTO, shows some condensation being formed in the first observed period, with the level of condensation greatly increasing through the second and third observed periods, and abating slightly by the fourth observed period. Indeed, the "crisscross" pattern is significantly blurry at the second observed period and barely visible during the third. The uncoated glass sample shows significant condensation during all observed periods. The "crisscross" pattern in the second and third observed periods cannot be seen. The FIG. 5 example thus demonstrates that the example embodiments described herein provide superior performance when compared to the current comparative example and uncoated glass.

"Peripheral" and "edge" seals herein do not mean that the seals are located at the absolute periphery or edge of the unit, but instead mean that the seal is at least partially located at or near (e.g., within about two inches) an edge of at least one substrate of the unit. Likewise, "edge" as used herein is not limited to the absolute edge of a glass substrate but also may include an area at or near (e.g., within about two inches) of an absolute edge of the substrate(s).

As used herein, the terms "on," "supported by," and the like should not be interpreted to mean that two elements are directly adjacent to one another unless explicitly stated. In other words, a first layer may be said to be "on" or "supported by" a second layer, even if there are one or more layers therebetween.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A vehicle windshield comprising:
first and second glass substrates of the vehicle windshield;
wherein the first and second glass substrates of the vehicle windshield are coupled together;
a coating comprising a plurality of layers provided on the first glass substrate, the plurality of layers including, moving away from the first glass substrate:
(a) a first dielectric layer comprising silicon nitride;
(b) a dielectric layer comprising an oxide of titanium;
(c) a dielectric layer comprising silicon oxynitride;
(d) a layer comprising indium-tin-oxide (ITO);
(e) a dielectric layer comprising silicon nitride; and
(f) a dielectric layer comprising an oxide of zirconium;
wherein the layer (f) comprising the oxide of zirconium is an uppermost layer of the coating and is the layer of the coating farthest from the first glass substrate;
wherein the coating is not located between the first and second glass substrates.

2. A vehicle windshield comprising:
first and second glass substrates of the vehicle windshield;
wherein the first and second glass substrates of the vehicle windshield are coupled together;
a coating comprising a plurality of layers provided on the first glass substrate, the plurality of layers including, moving away from the first glass substrate:
a first dielectric layer comprising silicon oxynitride;
a transparent conductive layer comprising indium tin oxide (ITO), located over and directly contacting the first dielectric layer comprising oxynitride;
a second dielectric layer comprising silicon oxynitride located over and directly contacting the transparent conductive layer comprising indium tin oxide (ITO),
a protective layer comprising oxygen and aluminum, the protective layer comprising oxygen and aluminum being located over the second dielectric layer comprising silicon oxynitride;
wherein the protective layer comprising oxygen and aluminum is the outermost layer of the coating and is to be exposed to an environment adjacent the windshield;
wherein the coating is disposed on a surface of the first glass substrate so that the first glass substrate is located between the coating and the second glass substrate, and wherein the coating is not located between the first and second glass substrates, and
wherein the coating has a hemispherical emissivity of less than 0.23 and a sheet resistance of less than 30 ohms/square.

3. The vehicle windshield of claim 2, wherein the windshield has a visible transmission of at least 70%.

* * * * *